United States Patent
Momoi et al.

(10) Patent No.: US 8,907,303 B2
(45) Date of Patent: Dec. 9, 2014

(54) STAGE DEVICE AND CONTROL METHOD FOR STAGE DEVICE

(75) Inventors: Yasuyuki Momoi, Tokyo (JP); Kaname Takahashi, Tokyo (JP); Shigeru Haneda, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/124,722

(22) PCT Filed: Jun. 6, 2012

(86) PCT No.: PCT/JP2012/064504
§ 371 (c)(1),
(2), (4) Date: Dec. 8, 2013

(87) PCT Pub. No.: WO2012/169505
PCT Pub. Date: Dec. 13, 2012

(65) Prior Publication Data
US 2014/0117251 A1 May 1, 2014

(30) Foreign Application Priority Data
Jun. 9, 2011 (JP) ................. 2011-128897

(51) Int. Cl.
*H01J 37/26* (2006.01)
*H01J 37/20* (2006.01)

(52) U.S. Cl.
CPC ....... *H01J 37/20* (2013.01); *H01J 2237/20285* (2013.01); *H01J 2237/20242* (2013.01); *H01J 2237/20292* (2013.01); *H01J 2237/28* (2013.01); *H01J 2237/20214* (2013.01)
USPC .................. 250/442.11; 250/306; 250/440.11

(58) Field of Classification Search
USPC ................. 250/306, 440.11, 442.11
See application file for complete search history.

(56) References Cited

U.S. PATENT DOCUMENTS 6,444,991 B1 * 9/2002 Yamada et al. .......... 250/442.11
7,348,559 B2 * 3/2008 Agemura et al. ............. 250/310
(Continued)

FOREIGN PATENT DOCUMENTS

DE 60029166 T2 6/2007
JP 2000-260379 A 9/2000
(Continued)

*Primary Examiner* — Michael Logie
(74) *Attorney, Agent, or Firm* — Miles & Stockbridge P.C.

(57) ABSTRACT

In the present invention, a stage device is configured to: provide a marker on a specimen, a specimen holder or a rotary table that allows measurement of position and direction; perform a rotation and translation movement of a stage according to a predetermined operation pattern; measure the position and direction of the marker there; identify the rotation center position of the rotary table from the results of this measurement; further create a correction value table relative to a rotation angle by calculating rotation-angle correction value for correcting the rotation error, and translation correction value for correcting a positional variation of the rotation center position; obtain from the correction value table the correction values associated with either an inputted rotation-angle command value or an actual rotation angle; and control the stage device by correcting either the rotation-angle and translation-position command values inputted or a rotation-angle and translation-position detected.

20 Claims, 9 Drawing Sheets

(56) References Cited

U.S. PATENT DOCUMENTS

| | | | |
|---|---|---|---|
| 7,863,564 B2 * | 1/2011 | Tsuneta et al. | 250/306 |
| 8,304,723 B2 * | 11/2012 | Agemura et al. | 250/310 |
| 8,334,520 B2 * | 12/2012 | Otaka et al. | 250/442.11 |
| 2001/0050343 A1 | 12/2001 | Kobaru et al. | |
| 2009/0045339 A1 | 2/2009 | Harada et al. | |
| 2011/0098960 A1 | 4/2011 | Mizuochi | |
| 2011/0260057 A1 * | 10/2011 | Otaka et al. | 250/307 |
| 2013/0319071 A1 * | 12/2013 | Vodnick et al. | 73/1.08 |

FOREIGN PATENT DOCUMENTS

| | | |
|---|---|---|
| JP | 2005-100676 A | 4/2005 |
| JP | 2007-018944 A | 1/2007 |
| JP | 2008-146990 A | 6/2008 |
| JP | 4515179 B2 | 7/2010 |
| WO | WO 2010/001790 A1 | 1/2000 |
| WO | WO 01/69643 A1 | 9/2001 |
| WO | WO 2006/082714 A1 | 8/2006 |
| WO | WO 2006/121108 A1 | 11/2006 |
| WO | WO 2010/047378 A1 | 4/2010 |

* cited by examiner

STAGE DEVICE AND CONTROL METHOD FOR STAGE DEVICE

CROSS-REFERENCE TO RELATED APPLICATIONS

The present application is a National Stage Application of PCT Application No. PCT/JP2012/064504 filed on Jun. 6, 2012, which claims benefit of Japanese Patent Application No. 2011-128897, filed on Jun. 9, 2011.

TECHNICAL FIELD

The present invention relates to a stage device that is mounted with a specimen for examination and moves the field of view by performing translational and rotational movements, in a charged particle beam device such as a scanning electron microscope, and a control method thereof.

BACKGROUND OF THE INVENTION

A scanning electron microscopy (SEM), a typical charged particle beam device, irradiates the surface of the specimen to be examined with electron beam (primary electron beam) by scanning it two-dimensionally, and makes the intensity of quadratic electrons generated secondarily from the specimen as an input for brightness modulation to an image that is scanned and generated in synchronization with the scanning of the primary electron beam, to obtain an SEM image of the surface of the specimen. At this time, the surface of the specimen for examination is selected by moving the stage that is mounted with the specimen. Normally, the operator operates the operation input unit such as a trackball while observing an SEM image for moving the stage until the portion of the surface of the specimen is obtained as the SEM image. An SEM is used for examination of flaws and defects in a semiconductor pattern, or the like, and recently the SEM is required to have higher magnification for examination as a semiconductor process becomes more microscopic. Therefore, a stage used in the SEM is also required to move in a more microscopic way with higher accuracy.

Incidentally, when examining a specimen having a similar fine pattern (cell) continuously such as a semiconductor wafer, an examination position is determined by scanning the specimen at a constant speed in a predetermined direction and counting, visually or by image processing, the number of cells that passes through the SEM screen. This is called a cell count and in order to do this, a rotational movement (rotation) is required to align the direction of a translational movement of the stage with the scanning direction of the specimen. In addition, when the shape of the specimen is three-dimensional, it is desired for the specimen to be examined in three dimensions by changing the viewing direction, and this also requires rotational movement.

As the stage operation is performed while observing the SEM image, it is desirable for the specimen to be rotatable about a virtual point that is set in the SEM image so that the field of view does not move when rotating the specimen. This operational feature is called rotation eucentric feature. On a conventional stage, a positional variation of the rotation center in the SEM image has been large due to eccentricity and/or whirling of the rotation axis, or due to a looseness and/or a backlash in an actuator and/or a transmission mechanism, then it has been difficult to keep the rotation center in the SEM image, especially during examination with high magnification. Therefore, when rotating the specimen, it has been necessary to follow steps such as to perform rotation after lowering the magnification for examination, then to increase the magnification again while adjusting the position in translation movement, thus making the operation complicated. In addition, it has been difficult to perform the examination continuously while rotating the specimen. A technique for correcting such a positional variation of the rotation center is, for example, disclosed in Japanese Patent No. 4515179B.

In addition, in Japanese Patent Application Publication No. 2000-260379A, a technique is disclosed for a scanning electron microscope, for correcting the electron beam scanning area using reference marks provided outside of a stage. Additionally, Japanese Patent Application Publication No. 2007-018944A, a configuration is disclosed for forming marks on a specimen stage in a charged particle beam device. Further, in Japanese Patent Application Publication No. 2008-146990A, a configuration is disclosed for providing markings on a specimen fixing table in a charged particle beam device, to detect a positional error by an external imaging device.

SUMMARY OF THE INVENTION

Description of Related Art

In the technique disclosed in Japanese Patent No. 4515179B, an exposure apparatus irradiates the proximity of the rotation center on a substrate with electron beam EB while rotating a rotation stage, draws a small-diameter measured circle on the substrate, which circle is examinable in its entirety by enlarging it with an SEM or the like, obtains the amount of eccentricity of the rotation axis by measuring the measured circle, and perform the correction. However, the method only obtains the amount of positional error from an outline of the measured circle drawn, but does not measure and correct an error of the rotation angle, then the positional error due to the rotation angle error is not corrected. The above problem has not been solved even with other patent documents.

The present invention has been made in view of such problems, and an objective of the present invention is to correct a swirl error in addition to the amount of positional error, thus providing a stage device that is capable of performing a rotation eucentric operation with high accuracy.

Means for Solving Problems

In order to solve above-described problems, the present invention provides a stage device that is mounted with a specimen and performs translational and rotational movement, and the stage device includes: a rotary table for mounting a specimen or a specimen holder attached with a specimen; a rotation mechanism for rotating the rotary table; a translation mechanism for translating the rotary table; and a stage controller for controlling the rotation mechanism and the translation mechanism according to a rotation angle command value and a translation position command value inputted from the outside, wherein the stage device is configured to: provide a marker on the specimen, the specimen holder or the rotary table for making the position and direction of the marker measurable; measure the position and direction of the marker when the rotating mechanism and the translation mechanism are operated according to a predetermined operation pattern; identify the position of the rotation center of the rotary table from the results of this measurement; further create a correction value table having rotation angle correction value for correcting the rotation error of the rotary table, and translation correction value for correcting the positional variation of the rotation center of the rotary table, relative to the rotation angle; obtain from the correction value table the rotation angle correction value and the translation correction value associated with one of the rotation angle command value inputted and an actual rotation angle; and control the rotation mechanism and the translation mechanism using these correction values obtained.

This correction value table is created by: measuring the position and direction of the marker when rotating only the rotation mechanism; calculating from the results the position of the rotation center of the rotary table and the rotation angle correction value for correcting the rotation error; further measuring at least the position, preferably the position and direction, of the marker when moving the rotation mechanism and the translation mechanism so as to be rotated with the marker as a virtual position of the rotation center; calculating from the results the translation correction value for correcting the positional variation of the position of the rotation center of the rotary table; and creating from these the correction value table relative to the rotation angle.

In addition, a control method using the correction value table includes: obtaining from the correction value table the rotation angle correction value and the translation correction value associated with the rotation angle command value inputted; obtaining correction command values that add the obtained correction values, respectively, to the inputted command values; and performing control using them as new command values.

Alternative method is provided with a rotation angle detecting unit for detecting a rotation angle, and a translation position detecting unit for detecting a translation position, to obtain from these an actual rotation angle and an actual translation position, to obtain from the correction value table the rotation angle correction value and the translation correction value, relative to the actual rotation angle, and to perform control using the values obtained by subtracting the correction values, respectively, from the actual rotation angle and the actual translation position as feedback amounts.

Further, the marker used in the present invention allows the position and direction to be identified, and is provided with at least two or more characteristic points, or an outline having one or less axis of symmetry. Furthermore, the marker can be selected by the operator while observing the SEM image.

It is desirable for the stage device of the present invention to use a driving unit and a power transmission mechanism that have small looseness, backlash, or the like, for example, a piezo motor.

Effects of Invention

According to the present invention, a stage device includes: a marker that is provided on a specimen or the like and makes the position and direction of the marker measurable; a marker-position-and-direction measuring unit that measures the position and direction of the marker when operating a rotation mechanism and a translation mechanism according to a predetermined operation pattern; a rotation center identifying unit that identifies the position of the rotation center of the rotary table from the results of the measurements; a correction-amount-table creating unit that creates a rotation angle correction value for correcting the rotation error of the rotary table and a translation correction value for correcting the positional variation of the position of the rotation center of the rotary table, as correction values relative to the rotation angle; a correction value table for recording the rotation angle correction value and the translation correction value; and a rotation mechanism controller and a translation mechanism controller that obtain the rotation angle correction value and the translation correction value, respectively, from the correction value table, associated with the rotation angle command value or the actual rotation angle, and control the rotation mechanism and the translation mechanism, respectively, using the correction values obtained. Thus it is possible to provide a stage device that can perform a rotation eucentric operation with high accuracy, by correcting the rotational angle correction value and the translation correction value.

EMBODIMENT OF THE INVENTION

Hereinafter, embodiments of the present invention will be described with reference to the drawings.

First Embodiment

CONFIGURATION OF SEM: In a first embodiment of the present invention, a description will be given of the structure of an SEM using a stage device with reference to FIG. 2. In the first embodiment, an SEM 1 includes a barrel 2 provided with an electro-optical system, a specimen chamber 3, and a stage 11. A primary electron beam 5 generated from an electron gun 4 is irradiated onto a specimen 12 through a convergent lens 6 and an objective lens 7, while a secondary electron 9 generated from the specimen 12 is detected by a secondary electron detector 10. The primary electron beam 5 two-dimensionally scans the surface of the specimen 12 to be examined by a scanning polarizer 8. As well as controlling the scanning of the primary electron beam 5 by the scanning polarizer 8, the electro-optical system controller 13 inputs intensity of the secondary electron 9 detected by the secondary electron detector 10 for brightness modulation of an image which is scanned and generated in synchronization with the scanning of the primary electron beam, to generate an image of the specimen surface (SEM image) for examination.

Figure 2:
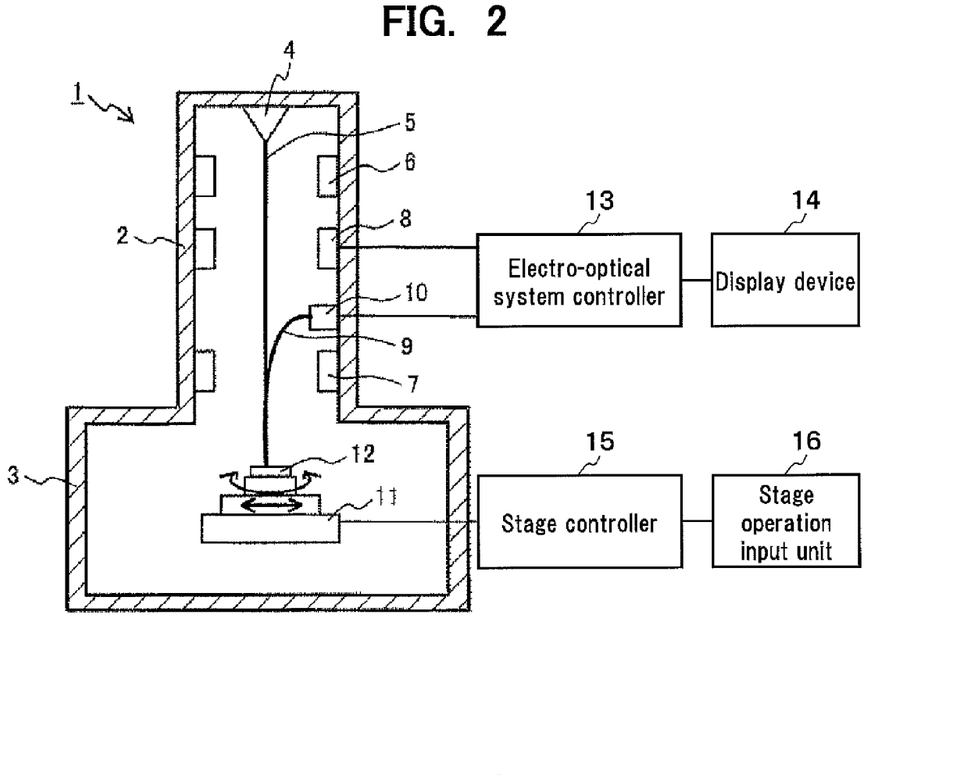
FIG. 2 is a schematic diagram showing an SEM using the stage device of the first embodiment of the present invention.

The SEM image generated is displayed on a display device 14. The specimen 12 to be examined is mounted on the stage 11 disposed in the specimen chamber 3. The stage 11 is intended to translate and rotate the specimen 12, having the degree of freedom such as a horizontal direction (XY direction), a vertical direction (Z direction), a rotation (rotation about the Z-axis), and an inclination (rotation around the X axis). A stage controller 15 controls the stage 11 according to inputs from a stage operation input unit 16 such as a trackball and a joystick, for example. The stage operation input unit 16 may be a PC connected via a network, a serial cable, or the like with the stage controller 15. The rotation operation of the first embodiment is performed by first setting the position of a virtual rotation center in the SEM image that is displayed on the display device 14, to enter a rotation angle by the stage operation input unit 16.

STAGE DEVICE: A description will be given of an example of a specific configuration of the stage device according to the first embodiment, with reference to FIG. 3. The stage 11 includes a rotary table 210 on which the specimen is mounted directly or via the specimen holder, a rotation mechanism 200 that rotates the rotary table 210, and a translation mechanism 100 that translates the rotary table 210.

Figure 3:
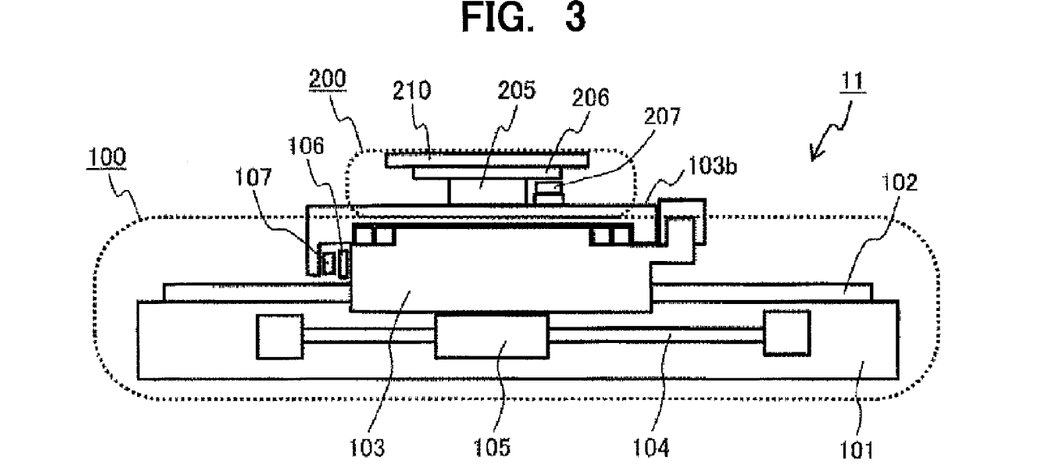
FIG. 3 is a front view of the stage device according to the first embodiment of the present invention.

The stage translates and rotates the specimen by moving the translation mechanism 100 and the rotation mechanism 200, and further embodies a rotation operation which center is a virtual point provided at a position different from the rotation axis of the rotary table 210, that is, a rotation eucentric operation, by moving the translation mechanism 100 and the rotation mechanism 200 in concert.

By attaching a linear guide 102 to a base 101, for example, the translation mechanism 100 moves the movable table 103 along with the guide. A linear motor is used as a translation mechanism driving unit for driving the movable table 103. The movable table 103 is moved by mounting a shaft 104 of the linear motor to the base and the motor body 105 to the movable table, then moving the motor body 105 along the shaft 104.

A linear scale may be used as a translation position detecting unit for detecting a position of the movable table 103. Slits are provided at regular intervals on a linear scale 106 mounted on the base 101, and a sensor head 107 attached to the movable table 103 moves on the slits. A pulse is generated each time the sensor head 107 passes through the slit, so the position of the movable table 103 relative to the base 101 is obtained by counting the pulses. In order to provide a translation having two degrees of freedom, two-tiered translation mechanism may be used, as shown in FIG. 3.

The rotation mechanism 200 is configured by installing a rotary motor 205 on the movable table 103b at the top of the translation mechanism 100, then installing the rotary table 210 into the shaft of the rotary motor 205. A rotary scale 206 is used as a rotation angle detecting unit for detecting the rotation angle of the rotary table 210. Similar to the linear scale, slits are provided at regular angular intervals in the rotary scale 206 attached to the rotary table 210, and the rotation angle of the rotary table 210 relative to the movable table 103b is obtained by reading the slit with a sensor head 207 mounted on the movable table 103b.

Note that a stage mechanism covered in the first embodiment is acceptable as long as it includes a rotation mechanism for rotating the specimen and a translation mechanism for translating the specimen, and the present invention is not limited to the rotation mechanism and the translation mechanism according to the first embodiment.

MARKER SETTING: In the present invention, the specimen, the specimen holder, or the rotary table is provided with a marker for measuring the position and direction thereof, to measure the position and direction of the marker when the rotation mechanism and the translation mechanism are moved according to a predetermined pattern, and to obtain from the measurement results the rotational center (position) of the rotary table, and the correction value for correcting the rotation error and the positional variation of the rotation center.

Figure 4:
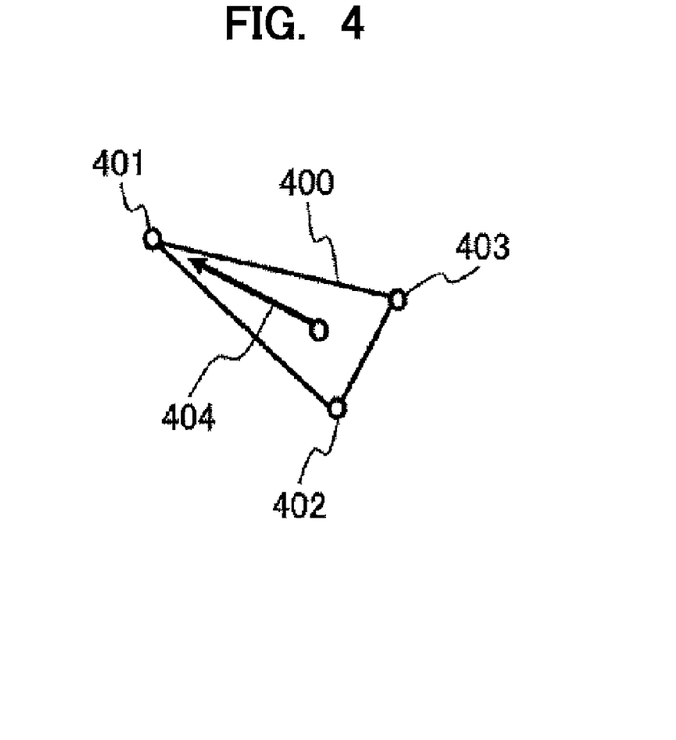
FIG. 4 is a schematic view showing a marker according to the first embodiment of the present invention.

The marker for use in the present invention employs a characteristic figure that can be identified in the SEM image, and additionally the position and direction can be measured at the same time. For example, a triangle 400 as shown in FIG. 4 is used, where respective vertices 401, 402, 403 of the triangle 400 are set as characteristic points.

When using such a marker having a plurality of characteristic points, a centroidal position among the characteristic points 401, 402, 403 may be used as a representative position of the marker, and a line segment connecting two characteristic points (desirably to use a line segment connecting the two most distant points) or a vector 404 from the centroidal position toward the one characteristic point as a direction of the marker. When using a marker having the plurality of characteristic points, at least two characteristic points are enough to be used as the marker.

Figure 5:
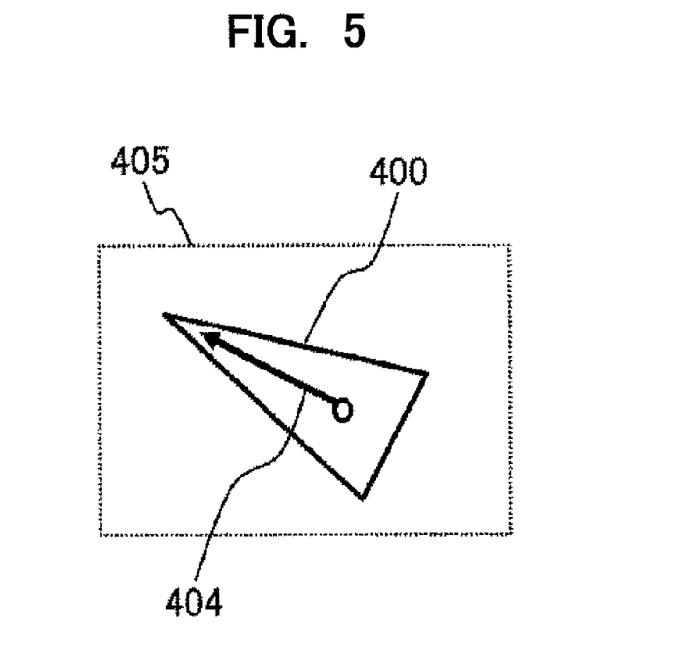
FIG. 5 is a schematic view showing an application example of the marker according to the first embodiment of the present invention.

In addition, as an application of the marker, it is possible to use an outline itself of the characteristic figure as shown in FIG. 5. This is effective when using an image processing device in that an area 405 including a characteristic FIG. 400 is selected, then edge enhancement processing for the area is performed, to extract the characteristic outline 400. The centroid of the outline pattern 400 may be used as a representative position of the marker, and the longest portion of the pattern may be used as a direction of the marker. However, when using an outline, as the direction cannot be determined unambiguously with more than one axis of symmetry, those figures having more than one axis of symmetry (such as a circle and a regular polygon) cannot be used.

DERIVATION OF CORRECTION AMOUNT FOR ROTARY TABLE: In the first embodiment, by moving the rotation mechanism 200 and the translation mechanism 100 according to a predetermined pattern, then measuring the position and direction of the marker at that time, the rotation center of the rotary table is identified, and the rotation angle correction value for correcting the rotation error and the translation correction value for correcting the positional variation of the rotation center are obtained. Its derivation method will be described hereinafter with reference to FIGS. 6 to 8.

Figure 6:
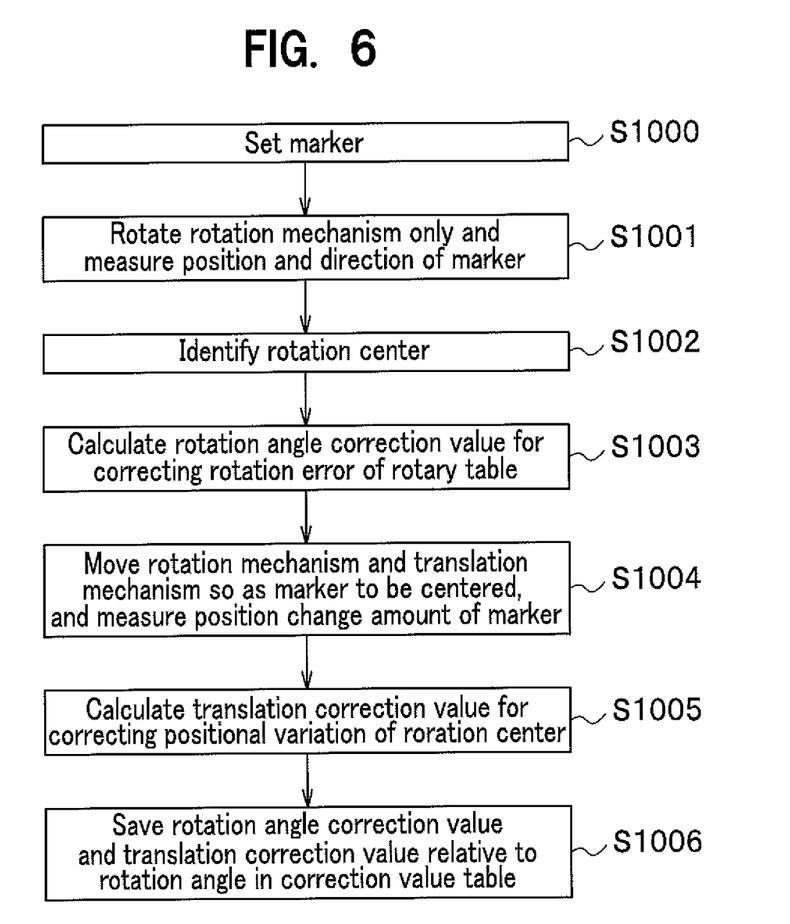
FIG. 6 is a flowchart of a process for obtaining a rotation center and a rotation angle correction value, and a translation correction value according to the first embodiment of the present invention.

To begin with, a description will be given of deriving the rotation center, and the rotation angle correction value and the translation correction value, with reference to the flowchart in FIG. 6. First, using the method described above, a marker is set on the specimen or the like (step S1000).

Figure 7:
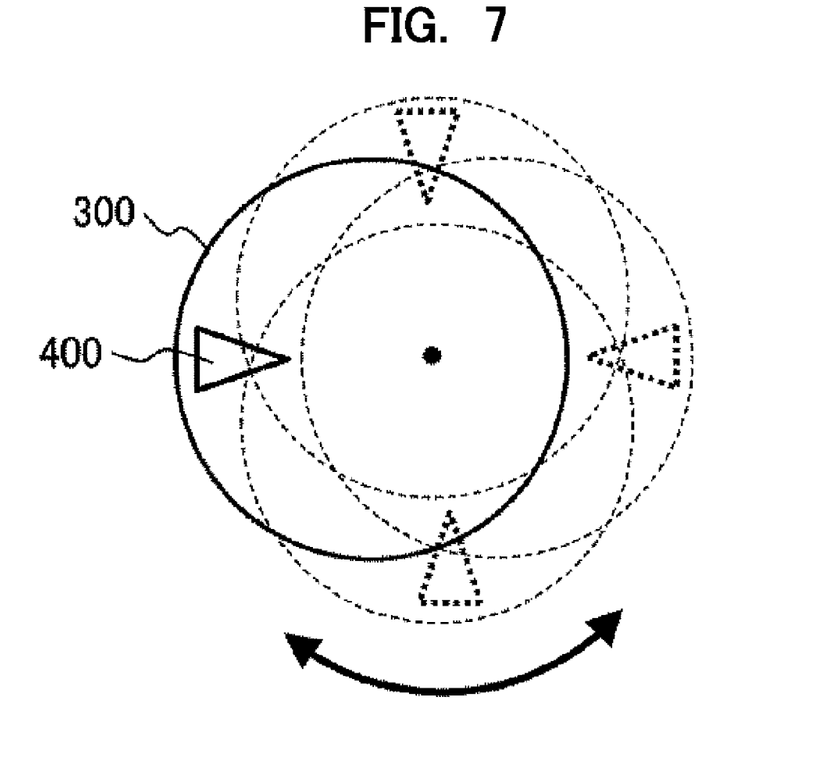
FIG. 7 is a schematic view showing an operation pattern for obtaining the rotation center and the rotation angle correction value according to the first embodiment of the present invention.

Next, only the rotation mechanism 200 is rotated to measure the position and direction of the marker (S1001). This is accomplished, for example as shown in FIG. 7, by moving only rotation mechanism 200 at constant angular increments, to measure the position and direction of the marker at that time. FIG. 7 shows the positions of the marker when it is rotated by 90 degrees. It may take at least three rotation angle command values, and the angular increments need not be strictly constant. As a result, when the measurement is performed, for example, by moving the rotation mechanism n times, the rotation angle command value for the rotation mechanism, the marker position and the marker direction measured at that time are defined as follows.

Rotation angle command value: $\theta ri$ ($i=1, \ldots, n$)
Marker position: $(Xi, Yi)$ ($i=1, \ldots, n$)
Marker direction: $\theta i$ ($i=1, \ldots, n$)

Next, the rotation center of the rotary table is identified (S1002). Assuming that the rotation center is at $(Xc, Yc)$, and the radius of rotation is R, the following relational expression holds.

[Formula 1]

$$(Xi-Xc)^2+(Yi-Yc)^2=R^2 \quad (1)$$

If the least square method is applied to this relational expression, it is possible to identify $(Xc, Yc)$ and R, both having the smallest error, respectively.

Next, the rotation angle correction value is calculated for correcting the rotation error of the rotary table (S1003). A rotation error $\Delta\theta i$ ($i=1, \ldots, n$) can be calculated as follows from the rotation angle command value and the marker direction $\theta i$.

[Formula 2]

$$\Delta\theta i=(\theta i-\theta \text{offset})-\theta ri \quad (2)$$

Here, $\theta$offset is an offset value in the marker direction relative to the rotation angle of the rotary table. It is possible to correct a rotation error by using this $\Delta\theta i$, then this may be used as the rotation angle correction value.

Note that S1002 and S1003 show an exemplary method for identification and calculation to be performed in the first embodiment, but the method may be another one that performs a calculation with high accuracy by combining the position and direction of the marker.

Next, the rotation mechanism 200 and the translation mechanism 100 are moved so as the marker to be centered, to measure position change amount, preferably the position and direction, of the marker (S1004). Simply assuming that only the rotation mechanism is moved with the rotation angle of $\theta ri$, ideal position coordinates of the marker become as follows.

$$(Xc+R\cos(\theta ri+\theta 0), Yc+R\sin(\theta ri+\theta 0))$$

Figure 8:
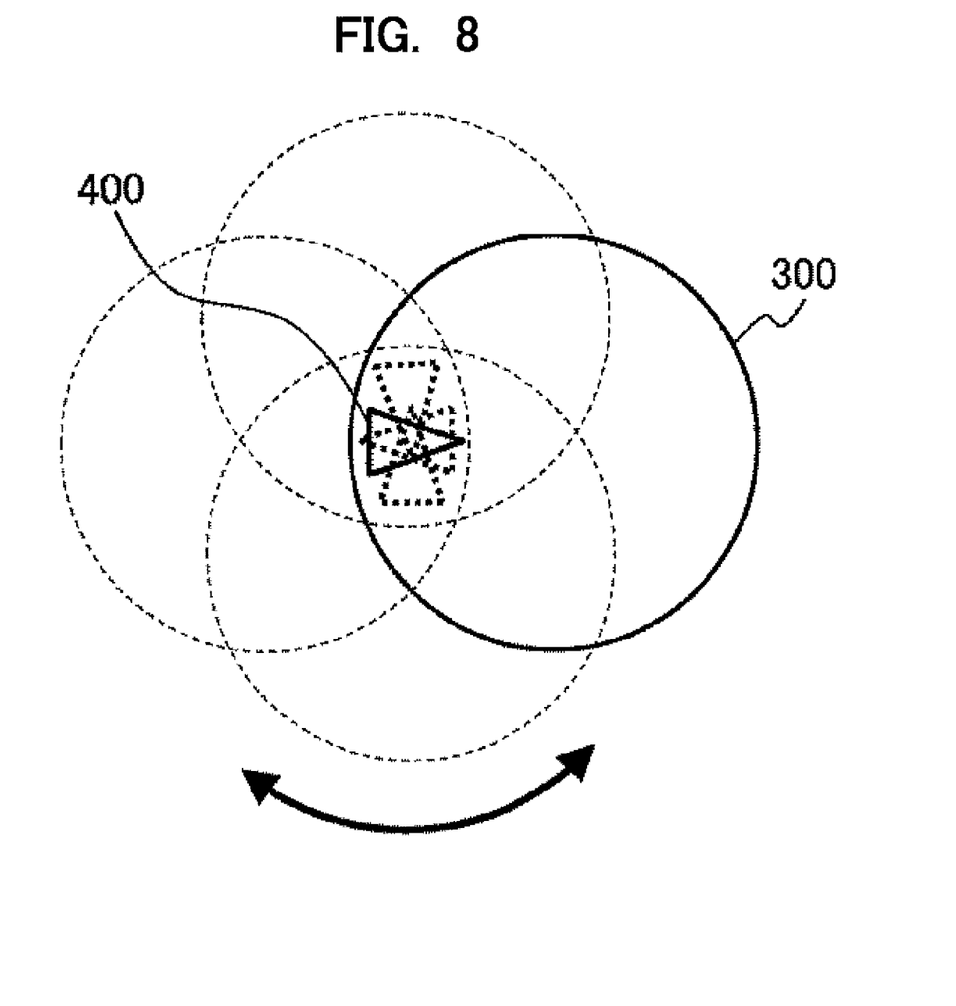
FIG. 8 is a schematic view showing an operation pattern for obtaining the translation correction value according to the first embodiment of the present invention.

Here, $\theta 0$ is the angle of the marker at the initial position relative to the rotary table angle origin. Therefore, when rotating the rotation mechanism, the rotation about the marker of the virtual rotation center can be implemented by moving the translation mechanism by varying amount of the marker position described above (this is a process for correcting of the position of the rotation center based on the geometric relationship, and called a geometric rotation correction). In this case, while performing the rotation angle correction obtained at S1003 and the geometric rotation correction described above, the position and direction of the marker are measured by changing the rotation angle of $\theta ri$ ($i=1, \ldots, n$), as shown in FIG. 8. FIG. 8 shows a state when it is rotated by 90 degrees.

Next, the translation correction value is obtained for correcting the positional variation of the rotation center (S1005). The measurement results of the position and direction of the marker at S1004 are assumed as follows respectively.

Marker position: $(X2i, Y2i)$ ($i=1, \ldots, n$),
Marker direction: $\theta 2i$ ($i=1, \ldots, n$)

In the case of simple eccentricity of the rotation axis and the inclination of the rotation axis, the positional variation of the rotation center can be corrected with the geometric rotation correction described above, but in the case of non-linear variation, this measurement causes a positional variation of the marker. As the amount of this positional variation of the marker corresponds to the positional variation of the rotation center, the amount of the positional variation of the marker may be used as the translation correction value.

Note here that the translation correction value is calculated by using the position of the marker, but such a calculation may be performed to obtain it with higher accuracy by using the position as well as direction of the marker.

The rotation angle correction value and the translation correction value obtained by measurement and calculation described above are saved as a correction value table indexed by rotation angle (S1006). When a rotation angle is given, its correction value is obtained from the correction value table.

Figure 9:
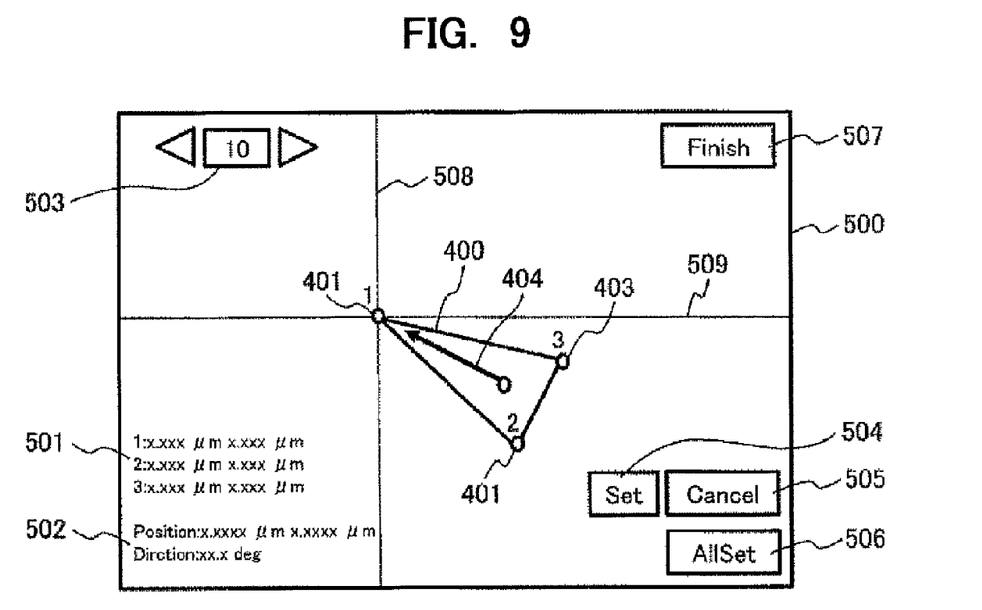
FIG. 9 is an explanatory view of the operation screen for measuring the position and direction of the marker according to the first embodiment of the present invention.
Figure 10:
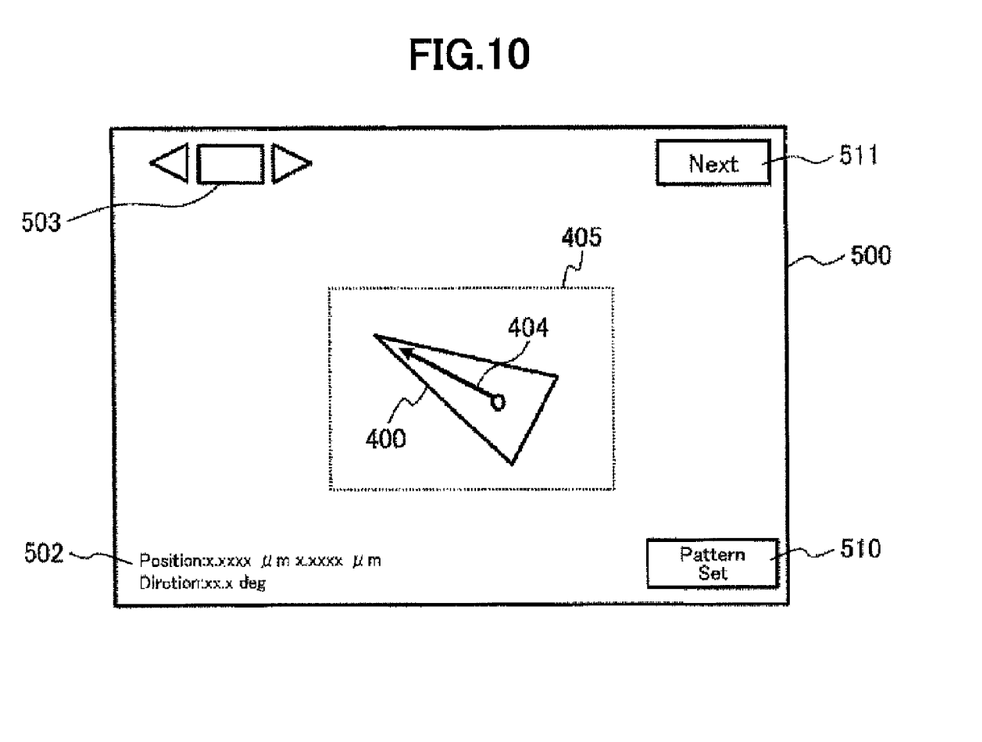
FIG. 10 is an explanatory view of the operation screen for setting the marker according to the first embodiment of the present invention.
Figure 11:
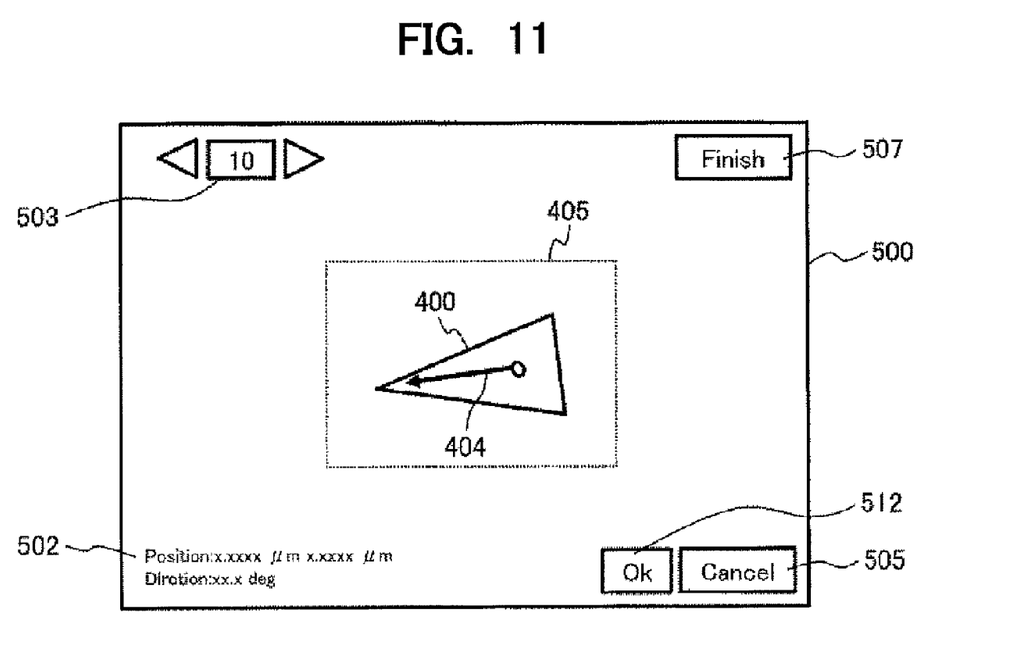
FIG. 11 is an explanatory view of the operation screen for measuring the position and direction of the marker in the application example according to the first embodiment of the present invention.

CORRECTION OPERATION WITH CHARACTERISTIC POINT MARKER: Next, a method for setting and measuring the marker will be described with reference to FIGS. 9-11. FIGS. 9-11 illustrate, when the marker shown in FIG. 4 has characteristic points of a characteristic figure, operation screens of the SEM image on the display device 14. In FIG. 9, the translation mechanism is moved first as desired, to display a marker 400 on an SEM image 500. For measuring the representative position and direction of the marker using characteristic points 401-403 at this time, an x-cursor 508 and a y-cursor 509 on the screen are moved to be positioned at the characteristic point, whose position is to be measured. Once positioned at the characteristic point, the position of the characteristic point is confirmed by pressing a set button 504, and its coordinates are displayed on the characteristic-point position display field 501. A numeral 505 is a Cancel button.

Upon completion of this work for all the characteristic points, an AllSet button 506 shall be pressed. Thus, the representative position and direction of the marker are calculated, and as well as the result is displayed on a marker-position-and-direction display field 502, the vector 404 is displayed in the SEM image.

The measurement shall be continued by changing the rotation angle command value, and upon completion of the measurement of all rotation angles, a Finish button 507 shall be pressed, then the identification of the rotation center, the calculation of the correction value, and the like are performed. An index display 503 is provided on the SEM image 500 for confirming the number of measured points.

CORRECTION OPERATION WITH OUTLINE MARKER: A correction method using the outline pattern shown in FIG. 5 as a marker will be described with reference to FIGS. 10 and 11. When using a shape pattern, the pattern must be registered first. FIG. 10 is an example of the registration screen. The shape pattern 400 to be registered shall be displayed in the SEM image by moving the translation mechanism. Then, the area 405 including the shape pattern shall be specified using the cursor, to press a PatternSet button 510. Thus, image processing such as edge enhancement and binarization is performed, to register the shape pattern 400 as a marker. A numeral 511 is a Next button.

FIG. 11 shows an example of an operation method when measuring the position and direction of the marker. The translation mechanism is moved as desired, to display the registered shape pattern in the SEM image 500. Upon specifying the area 405 as desired and pressing an OK button 512, the image processing such as edge enhancement, binarization, and pattern matching is performed to extract the shape pattern 400, representative position and direction thereof are obtained and displayed in the marker-position-and-direction display field 502, and the vector 404 is displayed in the SEM image as well.

The measurement shall be continued by changing the rotation angle command value, as is the case in the characteristic point marker, and upon completion of the measurement of all rotation angles, the Finish button 507 shall be pressed, then the identification of the rotation center, the calculation of the correction value, and the like are performed.

CONTROL OF STAGE DEVICE: Next, a description will be given of a method of controlling the stage device of the first embodiment with reference to FIG. 1. The stage device of the first embodiment includes the translation mechanism 100, the rotation mechanism 200, and a stage controller 300 that controls the translation mechanism 100 and the rotation mechanism 200 with respective command values provided from outside.

Figure 1:
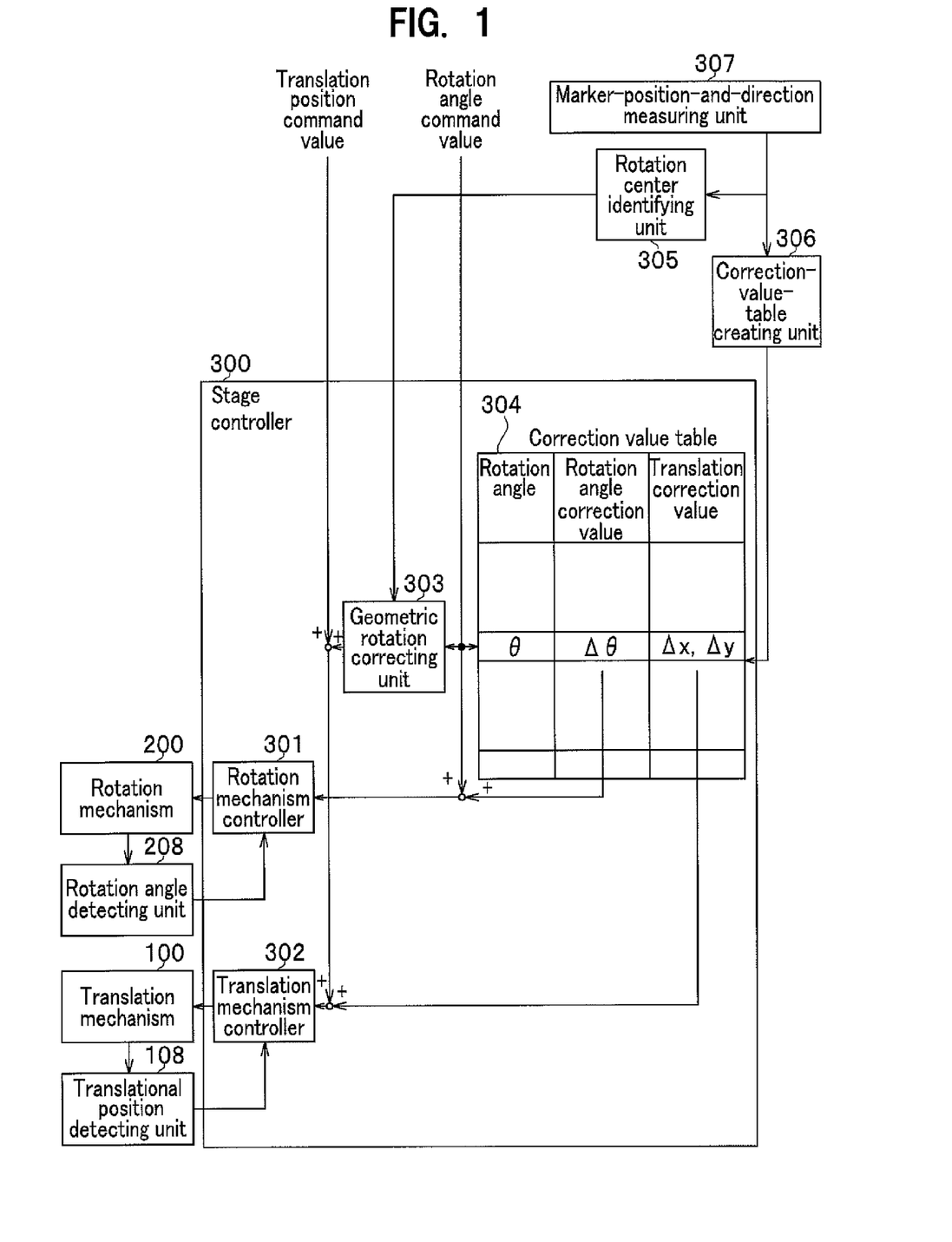
FIG. 1 is a block diagram showing a configuration of a stage device according to the first embodiment of the present invention.

The stage controller 300 includes: a rotation mechanism controller 301 that controls the rotation mechanism; a translation mechanism controller 302 that controls the translation mechanism; a geometric rotation correcting unit 303 that corrects the positional variation of the rotation center based on the geometric relationship when performing a rotation about the virtual center point; and a correction value table 304 that saves the rotation angle correction value and the translation correction value.

Additionally provided are: a rotation center identifying unit 305 that performs processing at S1002 to identify the rotation center; a correction-amount-table creating unit 306 that performs processing at S1003, S1005, S1006 to calculate the rotation angle correction value and the translation correction value and create the correction value table 303; and a marker-position-and-direction measuring unit 307. These may be included in the stage controller 300. Further provided are: a rotation angle detecting unit 208 having a rotary scale and a sensor head; and a translation position detecting unit 108 having a linear scale and a sensor head.

The stage device is operated as follows. First, before starting the operation, the rotation center is identified as a parameter for the geometric rotation correcting unit 303, and the correction value table 304 is created. When the rotation angle command value and the translation position command value are given from the outside, the rotation angle correction value and the translation correction value associated with the given rotation angle command value are obtained from the correction value table 304. The correction value table 304 is referred to by a rotation angle as an index, and when the given rotation angle command value falls between the adjacent indices, interpolation is performed to obtain the correction value.

The rotation angle correction value and translation correction value obtained are added to the rotation angle command value and the translation position correction value given, then accordingly the rotation mechanism controller 301 and the translation mechanism controller 302 are controlled to move the stage.

In the prior art, a positional variation of the virtual rotation center is generated by an amount obtained by multiplying the rotation error by the distance from the rotation axis to the virtual center. In the first embodiment, as the rotation error is corrected, the positional variation can be corrected by correcting the rotation angle. In addition, by saving the correction value relative to the rotation angle in the table, even non-linear variations that have not been corrected as simple deviations of the rotation center can be also corrected to implement a rotation eucentric operation with high accuracy.

It should be noted that the rotation mechanism 200 and the translation mechanism 100 in the stage device of the first embodiment have desirably no looseness, backlash, or the like in the actuator or the transmission mechanism. Then, piezo motors may be used as driving units of the translation mechanism 100 and the rotation mechanism 200, respectively, to reduce the looseness, backlash, or the like. This makes it possible to reduce variations independent of the rotation angle, non-linear variations, or the like, to implement a rotation eucentric operation with higher accuracy.

Second Embodiment

Figure 12:
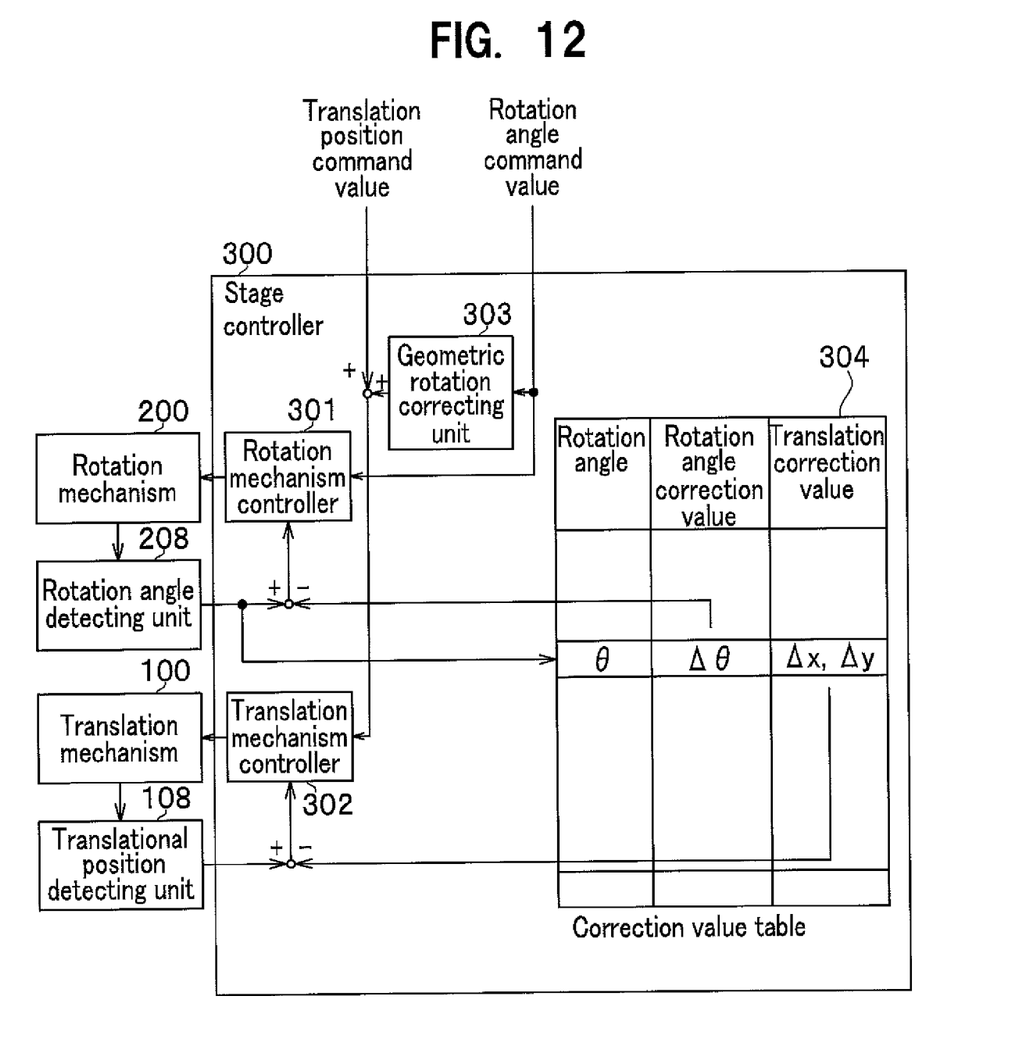
FIG. 12 is a block diagram showing a stage device according to a second embodiment of the present invention.

Next, a description will be given of a second embodiment of the present invention with reference to FIG. 12. The way for identifying the rotation center and creating the correction value table is the same as that of the first embodiment. A stage device of the second embodiment includes the translation mechanism 100, the translation position detecting unit 108, the rotation mechanism 200, the rotation angle detecting unit 208, and the stage controller 300, wherein the stage controller 300 includes the rotation mechanism controller 301, the translation mechanism controller 302, the geometric rotation correcting unit 303, and the correction value table 304. Although not shown, the rotation center identifying unit, the correction-amount-table creating unit, and the like are further provided within or outside the stage controller 300.

In the stage device of the second embodiment, those obtained are the rotation angle correction value and the translation correction value associated with the rotation angle detected by the rotation angle detecting unit 208. In the case the rotation angle falls between the adjacent indices in the correction value table, interpolation is performed to obtain the correction value.

The rotation angle correction value and the translation correction value obtained are subtracted from the rotation angle detected by the rotation angle detecting unit 208 and the translational position detected by the translation position detecting unit 108, respectively, then the resulting values are used as feedback amounts to the rotation mechanism controller 301 and the translation mechanism controller 302, respectively, to perform control.

Also with the configuration described above, the rotational error as well as the non-linear variations can be corrected to implement a rotation eucentric operation with high accuracy.

What is claimed is:

1. A stage device comprising:
    a rotary table for mounting a specimen directly or via a specimen holder;
    a rotation mechanism for rotating the rotary table;
    a translation mechanism for translating the rotary table;
    a stage controller for controlling, according to a rotation angle command value inputted from outside of the stage device and a translation position command value inputted from outside of the stage device, the rotation mechanism and the translation mechanism, respectively;
    a marker to be provided on one of the specimen, the specimen holder and the rotary table for making the position and direction measurable;
    a marker-position-and-direction measuring unit for measuring the position and direction of the marker when the rotating mechanism and the translation mechanism are operated according to a predetermined operation pattern;
    a rotation center identifying unit for identifying the position of the rotation center of the rotary table from the measuring results;
    a correction-amount-table creating unit for generating rotation angle correction value to correct the rotation error of the rotary table, and translation correction value to correct the positional variation of the rotation center of the rotary table, relative to a rotation angle;

a correction value table for recording the rotation angle correction value and the translation correction value; and a rotation mechanism controller and a translation mechanism controller for obtaining from the correction value table the rotation angle correction value and the translation correction value, respectively, which are associated with one of the rotation angle command value inputted and an actual rotation angle, then controlling the rotation mechanism and the translation mechanism, respectively, using these correction values obtained.

2. The stage device according to claim 1, wherein
the correction-amount-table creating unit measures the position and direction of the marker when rotating only the rotation mechanism, then calculates from the results the position of the rotation center of the rotary table and the rotation angle correction value for correcting the rotation error, and further
the correction-amount-table creating unit measures, using the position of the rotation center of the rotary table and the rotation angle correction value obtained, the position of the marker when moving the rotation mechanism and the translation mechanism so as to be rotated with the marker as a virtual position of the rotation center, then calculates from the results the translation correction value for correcting the positional variation of the position of the rotation center of the rotary table, and creates the correction value table relative to the rotation angle from the rotation angle correction value and the translation correction value calculated.

3. The stage device according to claim 2, wherein
the stage controller obtains from the correction value table the rotation angle correction value and the translation correction value associated with the rotation angle command value inputted, calculates correction command values that add the rotation angle correction value and the translation correction value obtained, respectively, to the rotation angle correction value and the translation correction value inputted, and controls the rotation mechanism and the translation mechanism according to the correction command values via the rotation mechanism controller and the translation mechanism controller.

4. The stage device according to claim 2, further provided with:
a rotation angle detecting unit for detecting the rotation angle of the rotary table; and
a translation position detecting unit for detecting a translation position of the rotary table,
wherein the stage device detects an actual rotation angle and an actual translation position by the rotation angle detecting unit and the translation position detecting unit, respectively, obtains from the correction value table the rotation angle correction value and the translation correction value, relative to the actual rotation angle, calculates a corrected rotation angle and a corrected translation position by subtracting the rotation angle correction value and the translation correction value, respectively, from the actual rotation angle and the actual translation position, and controls the rotation mechanism and the translation mechanism using the corrected rotation angle and the corrected translation position as feedback amounts.

5. The stage device according to claim 2, wherein
the marker is determined to be a pattern having at least two characteristic points in an SEM image, or a pattern having an outline with one or less axis of symmetry.

6. The stage device according to claim 2, further provided with
a marker selecting unit with which the operator selects the marker while observing the SEM image.

7. The stage device according to claim 1, wherein
the stage controller obtains from the correction value table the rotation angle correction value and the translation correction value associated with the rotation angle command value inputted, calculates correction command values that add the rotation angle correction value and the translation correction value obtained, respectively, to the rotation angle correction value and the translation correction value inputted, and controls the rotation mechanism and the translation mechanism according to the correction command values via the rotation mechanism controller and the translation mechanism controller.

8. The stage device according to claim 7, wherein
the marker is determined to be a pattern having at least two characteristic points in an SEM image, or a pattern having an outline with one or less axis of symmetry.

9. The stage device according to claim 7, further provided with
a marker selecting unit with which the operator selects the marker while observing the SEM image.

10. The stage device according to claim 1, further provided with:
a rotation angle detecting unit for detecting the rotation angle of the rotary table; and
a translation position detecting unit for detecting a translation position of the rotary table,
wherein the stage device detects an actual rotation angle and an actual translation position by the rotation angle detecting unit and the translation position detecting unit, respectively, obtains from the correction value table the rotation angle correction value and the translation correction value, relative to the actual rotation angle, calculates a corrected rotation angle and a corrected translation position by subtracting the rotation angle correction value and the translation correction value, respectively, from the actual rotation angle and the actual translation position, and controls the rotation mechanism and the translation mechanism using the corrected rotation angle and the corrected translation position as feedback amounts.

11. The stage device according to claim 10, wherein
the marker is determined to be a pattern having at least two characteristic points in an SEM image, or a pattern having an outline with one or less axis of symmetry.

12. The stage device according to claim 10, further provided with
a marker selecting unit with which the operator selects the marker while observing the SEM image.

13. The stage device according to claim 1, wherein
the marker is determined to be a pattern having at least two characteristic points in an SEM image, or a pattern having an outline with one or less axis of symmetry.

14. The stage device according to claim 1, further provided with
a marker selecting unit with which the operator selects the marker while observing the SEM image.

15. The stage device according to claim 1, wherein
a piezo motor is used as a driving unit for driving the rotation mechanism and the translation mechanism.

16. The stage device according to claim 1, wherein
the stage device is used in a charged particle beam device.

17. A control method for use in a stage device comprising:
a rotary table for mounting a specimen directly or via a specimen holder;
a rotation mechanism for rotating the rotary table;
a translation mechanism for translating the rotary table; and
a stage controller for controlling, according to a rotation angle command value inputted from outside of the stage device and a translation position command value inputted from outside of the stage device, the rotation mechanism and the translation mechanism, respectively,
the control method comprising steps of:
providing a marker on one of the specimen, the specimen holder and the rotary table for making the position and direction measurable;
measuring the position and direction of the marker when the rotating mechanism and the translation mechanism are operated according to a predetermined operation pattern;
identifying the position of the rotation center of the rotary table from the measuring results;
creating a correction value table that includes rotation angle correction value for correcting the rotation error of the rotary table, and translation correction value for correcting the positional variation of the rotation center of the rotary table, relative to a rotation angle;
obtaining from the correction value table the rotation angle correction value and the translation correction value associated with one of the rotation angle command value inputted and an actual rotation angle; and
controlling the rotation mechanism and the translation mechanism using these correction values obtained.

18. The control method for use in a stage device, according to claim 17,
wherein creating the correction value table comprises steps of:
measuring the position and direction of the marker when rotating only the rotation mechanism;
calculating from the results the position of the rotation center of the rotary table and the rotation angle correction value for correcting the rotation error;
measuring, using the position of the rotation center of the rotary table and the rotation angle correction value obtained, at least the position of the marker when moving the rotation mechanism and the translation mechanism so as to be rotated with the marker as a virtual position of the rotation center;
calculating from the results the translation correction value for correcting the positional variation of the position of the rotation center of the rotary table; and
creating the correction value table relative to the rotation angle from the rotation angle correction value and the translation correction value calculated.

19. The control method for use in a stage device, according to claim 17, further comprising steps of:
obtaining from the correction value table the rotation angle correction value and the translation correction value associated with the rotation angle command value inputted;
calculating correction command values that add the rotation angle correction value and the translation correction value obtained, respectively, to the rotation angle correction value and the translation correction value inputted; and
controlling the rotation mechanism and the translation mechanism according to the correction command values.

20. The control method for use in a stage device, according to claim 17, further comprising steps of:
detecting an actual rotation angle and an actual translation position respectively by a rotation angle detecting unit and a translation position detecting unit;
obtaining from the correction value table the rotation angle correction value and the translation correction value associated with the actual rotation angle;
calculating a corrected rotation angle and a corrected translation position by subtracting the rotation angle correction value and the translation correction value, respectively, from the actual rotation angle and the actual translation position; and
controlling the rotation mechanism and the translation mechanism using the corrected rotation angle and the corrected translation position as feedback amounts.

* * * * *